(12) United States Patent
Liu

(10) Patent No.: US 12,225,713 B2
(45) Date of Patent: Feb. 11, 2025

(54) SEMICONDUCTOR DEVICE, MANUFACTURING METHOD OF SEMICONDUCTOR DEVICE, AND STORAGE DEVICE

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/648,822

(22) Filed: Jan. 25, 2022

(65) Prior Publication Data

US 2022/0216212 A1 Jul. 7, 2022

Related U.S. Application Data

(63) Continuation of application No. PCT/CN2021/108543, filed on Jul. 27, 2021.

(30) Foreign Application Priority Data

Jan. 5, 2021 (CN) .......................... 202110005942.9

(51) Int. Cl.
H10B 12/00 (2023.01)
(52) U.S. Cl.
CPC ........... H10B 12/34 (2023.02); H10B 12/053 (2023.02)
(58) Field of Classification Search
None
See application file for complete search history.

(56) References Cited

U.S. PATENT DOCUMENTS

| 5,744,392 A | 4/1998 | Hsu |
| 9,153,656 B2 | 10/2015 | Iinuma |
| 10,879,398 B2 | 12/2020 | Lee et al. |
| 2015/0041876 A1 | 2/2015 | Iinuma |
| 2019/0221669 A1 | 7/2019 | Lee et al. |
| 2020/0194438 A1* | 6/2020 | Enomoto ........... H10B 12/0335 |
| 2020/0273863 A1 | 8/2020 | Zhu et al. |
| 2020/0381436 A1 | 12/2020 | Noh et al. |

(Continued)

FOREIGN PATENT DOCUMENTS

| CN | 102610575 A | 7/2012 |
| CN | 107527912 A | 12/2017 |
| CN | 107680969 A | 2/2018 |

(Continued)

*Primary Examiner* — Hsien Ming Lee
(74) *Attorney, Agent, or Firm* — Syncoda LLC; Feng Ma

(57) ABSTRACT

A semiconductor device includes a substrate, first word lines and second word lines; one or more first word line trenches and one or more second word line trenches are alternately arranged on the substrate in parallel; each first word line is arranged in a respective first word line trench; each second word line is arranged in a respective second word line trench, where width of the first word line trench is greater than width of the second word line trench, and depth of the first word line trench is less than depth of the second word line trench, so that width of the first word line is greater than width of the second word line, height of the first word line is less than height of the second word line, and threshold voltage of the first word line is greater than threshold voltage of the second word line.

16 Claims, 12 Drawing Sheets

(56) References Cited

U.S. PATENT DOCUMENTS

2021/0074860 A1 3/2021 Lee et al.
2021/0358920 A1* 11/2021 Luo ..................... H10B 12/053

FOREIGN PATENT DOCUMENTS

| CN | 207852681 U | * | 9/2018 | ............. H01L 29/78 |
| CN | 108899309 A | | 11/2018 | |
| CN | 110061003 A | | 7/2019 | |
| CN | 112018115 A | | 12/2020 | |

* cited by examiner

SEMICONDUCTOR DEVICE, MANUFACTURING METHOD OF SEMICONDUCTOR DEVICE, AND STORAGE DEVICE

CROSS-REFERENCE TO RELATED APPLICATIONS

This is a continuation of International Application No. PCT/CN2021/108543 filed on Jul. 27, 2021, which claims priority to Chinese Patent Application No. 202110005942.9 filed on Jan. 5, 2021. The disclosures of the above-mentioned applications are hereby incorporated by reference in their entirety.

BACKGROUND

The continuous reduction of the width of a word line of a transistor has been caused by the increase of the integration density of semiconductor devices and the size reduction of the semiconductor device. Due to the reduction of the width of the word line, the etching process is difficult to form a more uniform word line structure, resulting in the mismatch of performance between word lines.

It is to be noted that information disclosed in the above background part is merely used for enhancing understanding of the background of the disclosure, so that information, which does not constitute the conventional art known by those of ordinary skill in the art, may be included.

SUMMARY

The disclosure relates to the technical field of semiconductors, and in particular relates to a semiconductor device, a manufacturing method of the semiconductor device, and a storage device including the semiconductor device.

The purpose of the disclosure is to overcome the disadvantages of the above traditional art and to provide a semiconductor device, a manufacturing method of the semiconductor device, and a storage device including the semiconductor device.

According to a first aspect of the disclosure, a semiconductor device is provided, which may include a substrate, a first word line and a second word line. One or more first word line trenches and one or more second word line trenches are alternately arranged on the substrate in parallel. Each of the first word lines is arranged in a respective first word line trench. Each of the second word lines is arranged in a respective second word line trench. Herein, a width of the first word line trench is greater than a width of the second word line trench, and a depth of the first word line trench is less than a depth of the second word line trench, so that a width of the first word line is greater than a width of the second word line, a height of the first word line is less than a height of the second word line, and a threshold voltage of the first word line is greater than a threshold voltage of the second word line.

According to a second aspect of the disclosure, a storage device is provided, which may include a semiconductor device. The semiconductor device includes: a substrate, one or more first word line trenches and one or more second word line trenches being alternately arranged on the substrate in parallel; first word lines, each of which is arranged in a respective first word line trench; and second word lines, each of which is arranged in a respective second word line trench. Herein, a width of the first word line trench is greater than a width of the second word line trench, and a depth of the first word line trench is less than a depth of the second word line trench, so that a width of the first word line is greater than a width of the second word line, a height of the first word line is less than a height of the second word line, and a threshold voltage of the first word line is greater than a threshold voltage of the second word line.

According to a third aspect of the disclosure, a manufacturing method of a semiconductor device is provided, which may include the following operations. A substrate is formed, one or more first word line trenches and one or more second word line trenches being alternately arranged on the substrate in parallel. A first word line is formed in the first word line trench, and a second word line is formed in the second word line trench. Herein, a width of the first word line trench is greater than a width of the second word line trench, and a depth of the first word line trench is less than a depth of the second word line trench, so that a width of the first word line is greater than a width of the second word line, and a height of the first word line is less than a height of the second word line. Moreover, a threshold voltage of the first word line is greater than a threshold voltage of the second word line.

It is to be understood that the above general descriptions and detail descriptions below are merely exemplary and explanatory, which may not limit the disclosure.

BRIEF DESCRIPTION OF THE DRAWINGS

The drawings here, which are incorporated in and constitute a part of this specification, illustrate embodiments consistent with the disclosure and, together with the description, serve to explain the principles of the disclosure. It is apparent that the drawings described below are only some embodiments of the disclosure. Other drawings may further be obtained by those of ordinary skilled in the art according to these drawings without creative work.

Figure 1:
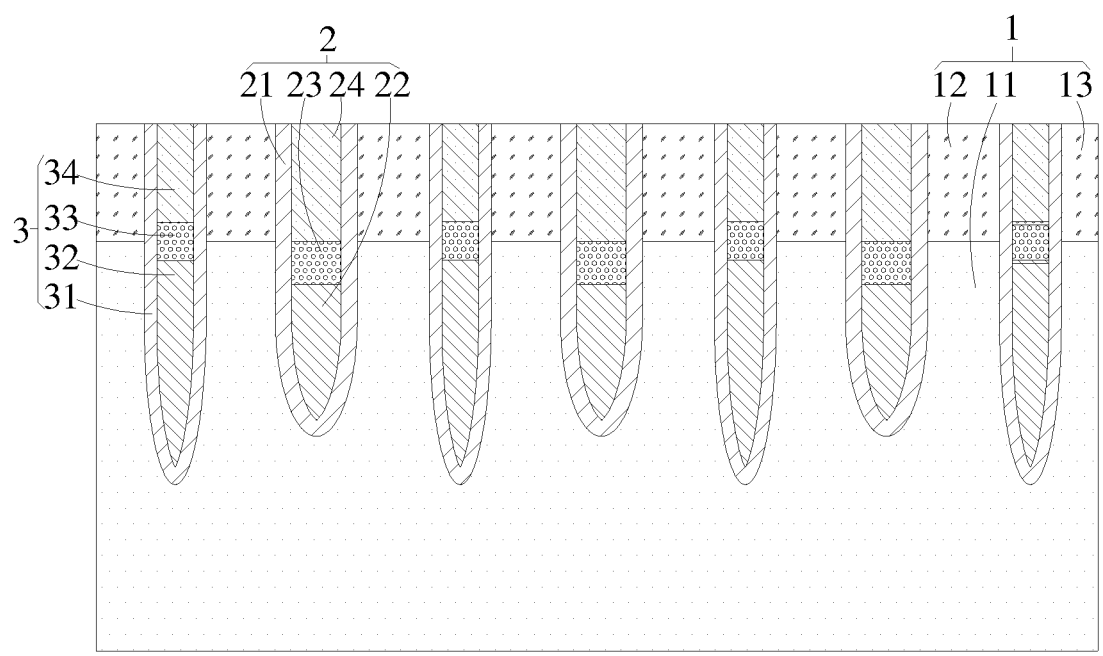
FIG. 1 is a schematic structural diagram of an exemplary implementation mode of a semiconductor device of the disclosure.

Description of the signs of main parts in the drawings are as follows:
1. Substrate; 11. Active area; 12. Source; 13. Drain; 14. First word line trench; 15. Second word line trench;
2. First word line; 21. First inter-gate dielectric layer; 211. First groove; 22. First conductive layer; 23. Second conductive layer; 24. First insulating layer;
3. Second word line; 31. Second inter-gate dielectric layer; 311. Third groove; 32. Third conductive layer; 33. Fourth conductive layer; 34. Second insulating layer;
41. First sacrificial layer; 42. Second sacrificial layer; 43. Fifth groove;
5. Mask layer; and 7. Bit line.

DETAILED DESCRIPTION

Exemplary implementation modes are described more comprehensively with reference to the drawings at present. However, the exemplary implementation modes may be implemented in many forms, and should not be understood as limitation to implementation modes described here. On the contrary, these provided implementation modes enable the disclosure to be more comprehensive and complete, and conceptions of the exemplary implementation modes are comprehensively conveyed to those skilled in the art. The same signs in the drawings show same or similar structures, so that detailed description of them are omitted.

The exemplary implementation mode provides a semiconductor device at first. Referring to a schematic structural diagram of a semiconductor device shown in FIG. 1 and FIG. 2, the semiconductor device may include a substrate 1, a first word line 2 and a second word line 3. First word line trenches 14 and second word line trenches 15 are alternately arranged on the substrate 1 in parallel. Each of the first word lines 2 is arranged in a respective first word line trench 14. Each of the second word lines 3 is arranged in a respective second word line trench 15. Herein, a width of the first word line trench 14 is greater than a width of the second word line trench 15, and a depth of the first word line trench 14 is less than a depth of the second word line trench 15, so that a width of the first word line 2 is greater than a width of the second word line 3, a height of the first word line 2 is less than a height of the second word line 3, and a threshold voltage of the first word line 2 is greater than a threshold voltage of the second word line 3.

According to the semiconductor device of the disclosure, a width of the first word line 2 is greater than a width of the second word line 3, and a height of the first word line 2 is less than a height of the second word line 3, so that a channel length of the first word line 2 is less than a channel length of the second word line 3, and the threshold voltage of the first word line 2 is greater than the threshold voltage of the second word line 3, so as to achieve the purpose of making a drain current 13 when the first word line 2 is saturated to be basically same as the drain current 13 when the second word line 3, thereby reducing the mismatch of performance between word lines.

It is to be noted that, the substrate 1 has a first surface and a second surface arranged opposite to each other, the first surface is located on the upper side of the substrate 1, and the second surface is located on the lower side of the substrate 1. The height of the first word line 2 and the height of the second word line 3 each refer to the distance perpendicular to the first surface and the second surface of the substrate 1. The height of the surface mentioned later is the distance between the surface and the second surface of the substrate 1.

Specific structures of the semiconductor device are described in detail below.

Figure 3:
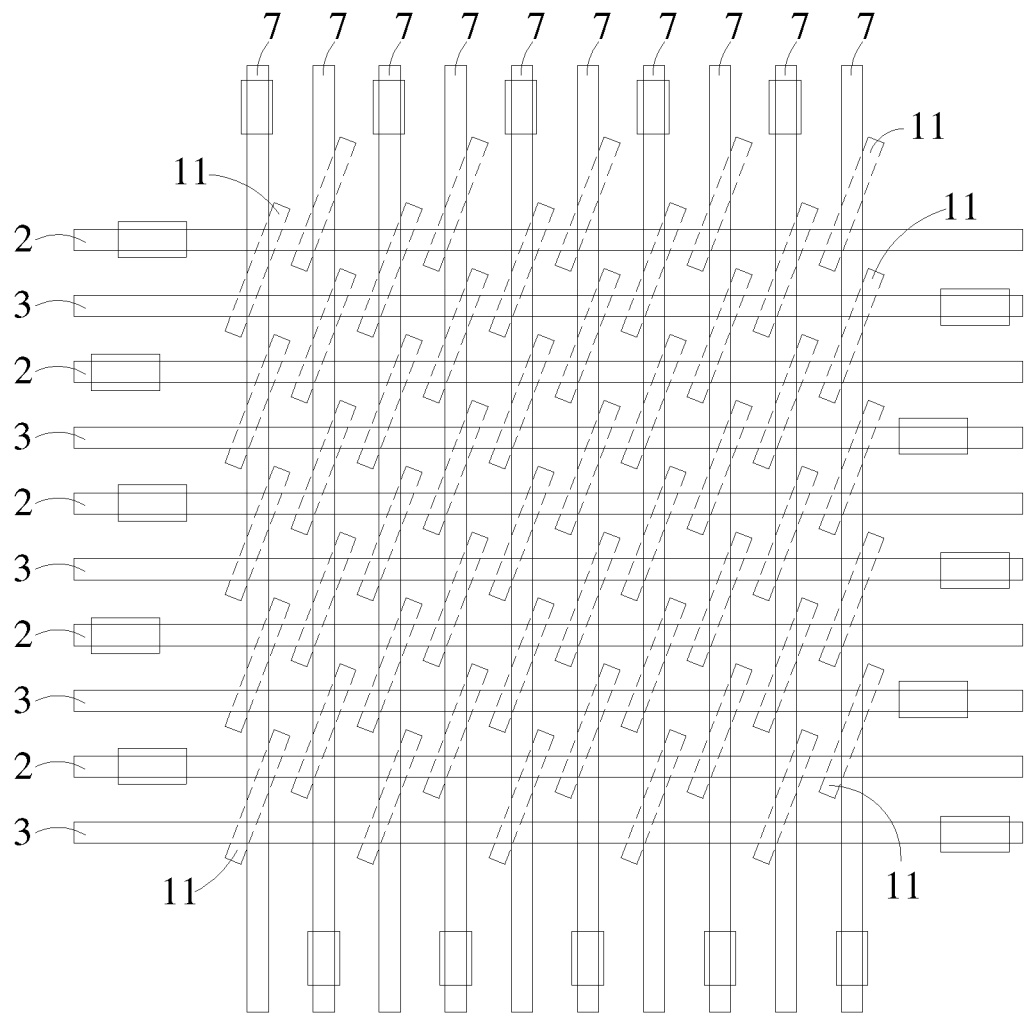
FIG. 3 is an overhead schematic structural diagram of a semiconductor device of the disclosure.

Referring to FIG. 1 and FIG. 3, in the exemplary implementation mode, the substrate 1 may include a plurality of active areas 11, a plurality of sources 12 and a plurality of drains 13. The source 12 and the drain 13 are located above respective active areas 11. The material of the substrate 1 may include silicon (Si), such as crystalline silicon, poly-Si or amorphous silicon.

The active area 11 may be in the shape of a slender island with a short axis and a long axis, and the plurality of active areas 11 are arranged in an array. The long axis of the active area 11 may be arranged in a direction parallel to the top surface of the substrate 1. In some exemplary implementation modes, the active area 11 may have a first conduction type. The first conduction type may be P type or N type.

A plurality of first word line trenches 14 and a plurality of second word line trenches 15 extending along the first direction are arranged on the substrate 1. The plurality of first word line trenches 14 and the plurality of second word line trenches 15 are arranged alternately, that is, a second word line trench 15 is arranged between two adjacent first word line trenches 14, and a first word line trench 14 is arranged between two adjacent second word line trenches 15. Both the first word line trench 14 and the second word line trench 15 intersect with the active area 11. The first word line trench 14 and the second word line trench 15 which are adjacent may intersect with the same active area 11. Certainly, one first word line trench 14 and one second word line trench 15 may also be arranged, which also falls within the scope of protection of the disclosure.

A width of the first word line trench 14 is greater than a width of the second word line trench 15, the width of the first word line trench 14 is greater than or equal to 10 nm and less than or equal to 20 nm, the width of the second word line trench 15 is greater than or equal to 10 nm and less than or equal to 20 nm, and a difference value between the width of the first word line trench 14 and the width of the second word line trench 15 is greater than or equal to 1 nm and less than or equal to 5 nm. Moreover, a depth of the first word line trench 14 is less than a depth of the second word line trench 15, the depth of the first word line trench 14 is greater than or equal to 100 nm and less than or equal to 200 nm, the depth of the second word line trench 15 is greater than or equal to 100 nm and less than or equal to 200 nm, and a difference value between the depth of the first word line trench 14 and the depth of the second word line trench 15 is greater than or equal to 3 nm and less than or equal to 20 nm.

The source 12 and the drain 13 may be located on both sides of respective first word line trenches 14 and the second word line trench 15, that is, part of the source 12 and the drain 13 are respectively located on both sides of respective first word line trenches 14, and part of the source 12 and the drain 13 are located on both sides of respective second word line trenches 15. The source 12 and the drain 13 may be impurity areas doped with impurities of a second conduction type different from the first conduction type. The second conduction type may be N type or P type. In the exemplary implementation mode, the source 12 and the drain 13 are doped with phosphorus.

Each of the first word lines 2 is arranged in a respective first word line trench 14, and each of the second word lines 3 is arranged in a respective second word line trench 15, so that the width of the first word line 2 is greater than the width of the second word line 3, and the height of the first word line 2 is less than the height of the second word line 3. An extension direction of the first word line 2 and the second word line 3 intersects with an extension direction of a bit line 7.

Please continuously referring to FIG. 1, specifically, the first word line 2 may include a first inter-gate dielectric layer 21, a first work function control layer (not shown in the figure), a first conductive layer 22, a second conductive layer 23 and a first insulating layer 24.

The first inter-gate dielectric layer 21 is arranged on a trench wall of the first word line trench 14, including a trench side wall and a trench bottom wall, and a first groove 211 adapted to the first word line trench 14 is still formed on the first inter-gate dielectric layer 21. The material of the first inter-gate dielectric layer 21 may be one or more of silicon oxide, silicon nitrogen and silicon nitrogen oxide. The thickness of the first inter-gate dielectric layer 21 is greater than or equal to 2 nm and less than or equal to 5 nm, and the dielectric constant of the first inter-gate dielectric layer 21 is greater than or equal to 3.8 and less than or equal to 4.2.

The first work function control layer is arranged on a groove wall of the first groove 211 on the first inter-gate dielectric layer 21, including a groove side wall and a groove bottom wall, but the first work function control layer does not cover the upper part of the groove wall of the first groove 211, that is, the height of the first work function control layer is lower than the depth of the first groove 211, the height of the first work function control layer may be the same as the sum of the heights of the first conductive layer 22 and the second conductive layer 23, and a second groove adapted to the first word line trench 14 is still formed on the first work function control layer. The material of the first work function control layer may be titanium (Ti) or titanium nitride (TiN), titanium aluminum nitride (TiAlN), titanium aluminum carbide (TiAlC), titanium aluminum carbon nitride (TiAlCN), titanium silicon carbon nitride (TiSiCN), tantalum (Ta), tantalum nitride (TaN), tantalum aluminum nitride (TaAlN), tantalum aluminum carbon nitride (TaAlCN) or tantalum silicon carbon nitride (TaSiCN), etc. Moreover, the first work function control layer is a single layer including one of the above materials or a stacked structure of at least two of the above materials. The first work function control layer may have a thickness of about 10 angstroms to about 50 angstroms. The first work function control layer may be formed by using an Atomic Layer Deposition (ALD) process or a Metal Organic Chemical Vapor Deposition (MOCVD) process.

The first conductive layer 22 is arranged in the second groove of the first work function control layer, but the second groove is not filled. The material of the first conductive layer 22 may include at least one of tungsten (W), tungsten nitride (WN), TiN and TaN. The first conductive layer 22 may include a material having good gap filling characteristics and relatively low resistivity.

The second conductive layer is arranged on the first conductive layer 22, and the second conductive layer 23 fills the second groove of the first work function control layer. The material of the second conductive layer 23 may be high N+ doping poly silicon. In other exemplary implementation modes of the disclosure, the material of the second conductive layer 23 may also be a material with a work function less than or equal to 4.55. An upper surface of the second conductive layer 23 is coplanar with a lower surface of the source 12 or the drain 13, that is, an orthographic projection of the second conductive layer 23 on a reference plane does not overlap with an orthographic projection of the source 12 or the drain 13 on the reference plane, where the reference plane is parallel to an extension direction of the first word line trench 14 and the second word line trench 15, and perpendicular to the substrate 1. Moreover, in other exemplary implementation modes of the disclosure, an upper surface of the second conductive layer 23 may also be higher or lower than the lower surfaces of the source 12 and the drain 13, as long as an overlapping area between an orthographic projection of the second conductive layer 23 on the reference plane and an orthographic projection of the source 12 and the drain 13 on the reference plane is smaller than an overlapping area between an orthographic projection of the fourth conductive layer 33 on the reference plane and the orthographic projection of the source 12 and the drain 13 on the reference plane.

The first insulating layer 24 is arranged on the second conductive layer 23, and the first insulating layer 24 fills the first groove 211 on the first inter-gate dielectric layer 21. The material of the first insulating layer 24 may be silicon nitride. Certainly, in other exemplary implementation modes of the disclosure, the material of the first insulating layer 24 may also be materials with relatively large dielectric constants such as silicon oxide and silicon oxynitride.

Please continuously referring to FIG. 1, specifically, the second word line 3 may include a second inter-gate dielectric layer 31, a second work function control layer (not shown in the figure), a third conductive layer 32, a fourth conductive layer 33 and a second insulating layer 34.

The second inter-gate dielectric layer 31 is arranged on a trench wall of the second word line trench 15, including a trench side wall and a trench bottom wall, and a third groove 311 adapted to the second word line trench 15 is still formed on the second inter-gate dielectric layer 31. The material of the second inter-gate dielectric layer 31 may be one or more of silicon oxide, silicon nitrogen and silicon nitrogen oxide. The thickness of the second inter-gate dielectric layer 31 is greater than or equal to 20 angstroms and less than or equal to 50 angstroms. In the exemplary implementation mode, the dielectric constant of the second inter-gate dielectric layer 31 may be the same as the dielectric constant of the first inter-gate dielectric layer 21, and the thickness of the second inter-gate dielectric layer 31 is less than the thickness of the first inter-gate dielectric layer 21. Therefore, the threshold voltage Vt1 of the first word line 2 is greater than the threshold voltage Vt2 of the second word line 3. However, the height of the first word line 2 is less than the height of the second word line 3, so that the channel length of the first word line 2 is less than channel length of the second word line 3, so as to achieve the purpose of making a drain current when the first word line 2 is saturated to be basically same as the drain current when the second word line 3 is saturated same basically, thereby reducing the mismatch of performance between word lines.

The second work function control layer is arranged on a groove wall of the third groove 311 on the second inter-gate dielectric layer 31, including a groove side wall and a groove bottom wall, but the second work function control layer does not cover the upper part of the groove wall of the third groove 311, that is, the height of the second work function control layer is lower than the depth of the third groove 311, the height of the second work function control layer may be the same as the sum of the heights of the third conductive layer 32 and the fourth conductive layer 33, and a fourth groove adapted to the second word line trench 15 is still formed on the second work function control layer. The material of the second work function control layer may be titanium (Ti) or titanium nitride (TiN), titanium aluminum nitride (TiAlN), titanium aluminum carbide (TiAlC), titanium aluminum carbon nitride (TiAlCN), titanium silicon carbon nitride (TiSiCN), tantalum (Ta), tantalum nitride (TaN), tantalum aluminum nitride (TaAlN), tantalum aluminum carbon nitride (TaAlCN) or tantalum silicon carbon nitride (TaSiCN), etc. Moreover, the second work function control layer is a single layer including one of the above materials or a stacked structure of at least two of the above materials. The second work function control layer may have a thickness of about 10 angstroms to about 50 angstroms. The second work function control layer may be formed by using an Atomic Layer Deposition (ALD) process or a Metal Organic Chemical Vapor Deposition (MOCVD) process.

The third conductive layer 32 is arranged in the fourth groove of the second work function control layer, but the fourth groove is not filled. The material of the third conductive layer 32 may include at least one of tungsten (W), tungsten nitride (WN), TiN and TaN. The third conductive layer 32 may include a material having good gap filling characteristics and relatively low resistivity.

The fourth conductive layer is arranged on the third conductive layer 32, and the fourth conductive layer 33 fills the fourth groove of the second work function control layer. The material of the fourth conductive layer 33 may be high N+ doping poly silicon. In other exemplary implementation modes of the disclosure, the material of the fourth conductive layer 33 may also be a material with a work function less than or equal to 4.55. An upper surface of the fourth conductive layer 33 is coplanar with a lower surface of the source 12 or the drain 13, that is, an orthographic projection of the fourth conductive layer 33 on a reference plane is overlapped with an orthographic projection of the source 12 or the drain 13 on the reference plane, where the reference plane is parallel to an extension direction of the first word line trench 14 and the second word line trench 15, and perpendicular to the substrate 1. Moreover, in other exemplary implementation modes of the disclosure, as long as an overlapping area between an orthographic projection of the second conductive layer 23 on the reference plane and an orthographic projection of the source 12 or the drain 13 on the reference plane is smaller than an overlapping area between an orthographic projection of the fourth conductive layer 33 on the reference plane and the orthographic projection of the source 12 or the drain 13 on the reference plane.

The second insulating layer 34 is arranged on the fourth conductive layer 33, and the second insulating layer 34 fills the fourth groove on the second inter-gate dielectric layer 31. The material of the second insulating layer 34 may be silicon nitride. Certainly, in other exemplary implementation modes of the disclosure, the material of the second insulating layer 34 may also be materials with relatively large dielectric constants such as silicon oxide and silicon oxynitride.

Figure 2:
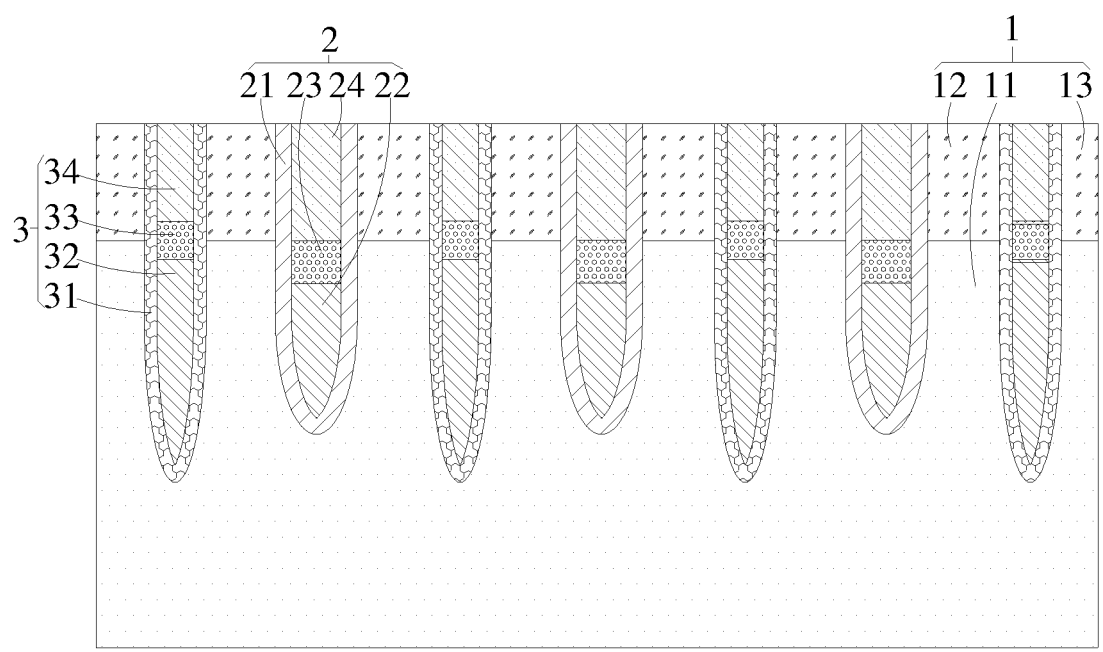
FIG. 2 is a schematic structural diagram of another exemplary implementation mode of a semiconductor device of the disclosure.

It is to be noted that, in other exemplary implementation modes of the disclosure, referring to FIG. 2, a material of the second inter-gate dielectric layer 31 is different from a material of the first inter-gate dielectric layer 21, and a dielectric constant of the second inter-gate dielectric layer 31 may be greater than a dielectric constant of the first inter-gate dielectric layer 21. For example, the material of the second inter-gate dielectric layer 31 may be SiON with a dielectric constant of about 5.0. The second inter-gate dielectric layer 31 may also select a material with a dielectric constant greater than or equal to 7 and less than or equal to 25. The material of the first inter-gate dielectric layer 21 may be SiO2 with a dielectric constant of about 3.9. The dielectric constant of the second inter-gate dielectric layer 31 is greater than the dielectric constant of the first inter-gate dielectric layer 21, and similarly, the threshold voltage $V_{t1}$ of the first word line 2 may be greater than the threshold voltage $V_{t2}$ of the second word line 3. In combination, the height of the first word line 2 is less than the height of the second word line 3, so that a channel length of the first word line 2 is less than a channel length of the second word line 3, so as to achieve the purpose of making a drain current when the first word line 2 is saturated to be basically same as the drain current when the second word line 3 is saturated same basically, thereby reducing the mismatch of performance between word lines.

Certainly, it may also be that, the thickness of the second inter-gate dielectric layer 31 is equal to the thickness of the first inter-gate dielectric layer 21, and the dielectric constant of the second inter-gate dielectric layer 31 is greater than dielectric constant of the first inter-gate dielectric layer 21. As long as an appropriate value is selected so that the threshold voltage $V_{t1}$ of the first word line 2 is greater than the threshold voltage $V_{t2}$ of the second word line 3 and adapted to the difference between the channel length of the first word line 2 and the channel length of the second word line 3.

Furthermore, the exemplary implementation mode further provides a storage device, which may include any semiconductor device above. The specific structure of the semiconductor device has been described in detail above, so it will not be elaborated here.

The storage device may be a Dynamic Random Access Memory (DRAM) or a trench gate device.

Compared with the traditional art, the beneficial effect of the storage device provided in the exemplary implementation mode of the disclosure is the same as that of the storage device of the semiconductor device provided by the above exemplary implementation mode, which will not be elaborated here.

Figure 4:
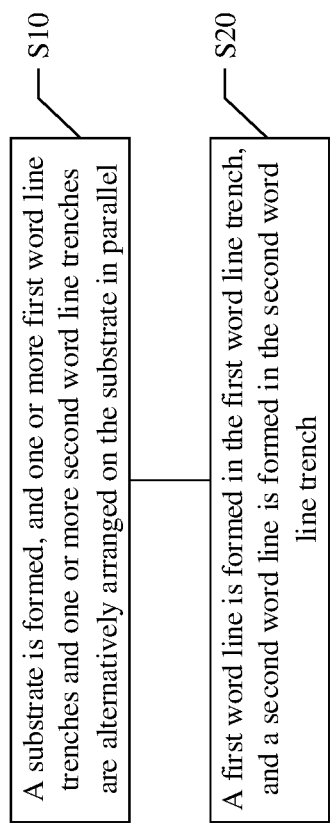
FIG. 4 is a schematic flow block diagram of an exemplary implementation mode of a manufacturing method of a semiconductor device of the disclosure.

Furthermore, the exemplary implementation mode also provides a manufacturing method of a semiconductor device. Referring to a schematic flow block diagram of an exemplary implementation mode of a manufacturing method of a semiconductor device of the disclosure shown in FIG. 4, the manufacturing method of a semiconductor device may include the following steps.

At S10, a substrate 1 is formed, first word line trenches 14 and second word line trenches 15 being alternately arranged on the substrate 1 in parallel.

At S20, a first word line 2 is formed in the first word line trench 14, and a second word line 3 is formed in the second word line trench 15.

Herein, a width of the first word line trench 14 is greater than a width of the second word line trench 15, and a depth of the first word line trench 14 is less than a depth of the second word line trench 15, so that a width of the first word line 2 is greater than a width of the second word line 3, a length of the first word line 2 is less than a length of the second word line 3, and a threshold voltage of the first word line 2 is greater than a threshold voltage of the second word line 3.

Various steps of the manufacturing method of a semiconductor device are described in detail below.

Figure 5:
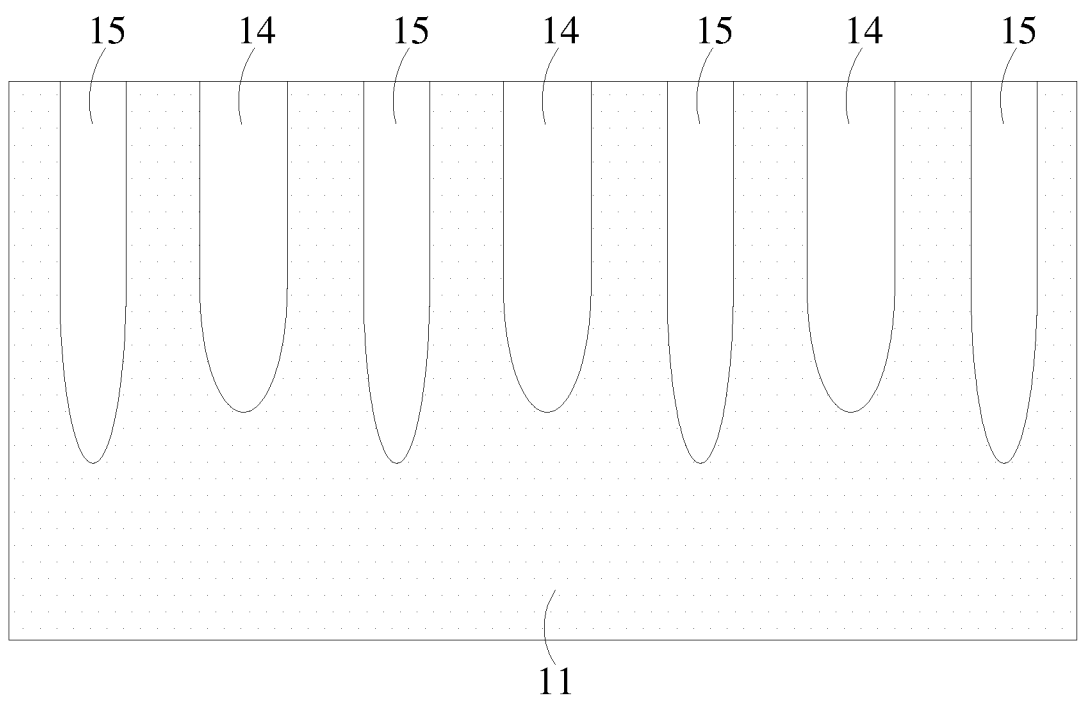
FIG. 5 is a first schematic structural diagram of various steps of manufacturing a semiconductor device in FIG. 1.

Reference is made to FIG. 5.

A base substrate of the substrate 1 is provided, and a plurality of active areas 11 are formed on the base substrate of the substrate 1 through a doping process. The base substrate of the substrate 1 is provided with a first surface and a second surface arranged opposite to each other.

The first surface of the substrate 1 is etched by a plasma etching process to form a plurality of first word line trenches 14 arranged in parallel and extending along the first direction. The plasma etching emission angle at this time is relatively divergent.

The first word line trenches 14 formed in the previous step are masked, and a voltage or magnetic field is applied to the second surface of the substrate 1. A part between two adjacent first word lines 2 on the first surface of the substrate 1 is etched by the plasma etching process to form a plurality of second word lines 3 arranged in parallel and extending along the first direction. Due to the action of an electric field or magnetic field formed by the applied voltage, the plasma emission angle is more perpendicular to the substrate 1, and the speed of the plasma bombarding the surface of the substrate 1 is increased, so that a width of the formed second word line trench 15 is less than a width of the first word line trench 14, and a depth of the second word line trench 15 is greater than a depth of the first word line trench 14.

Figure 6:
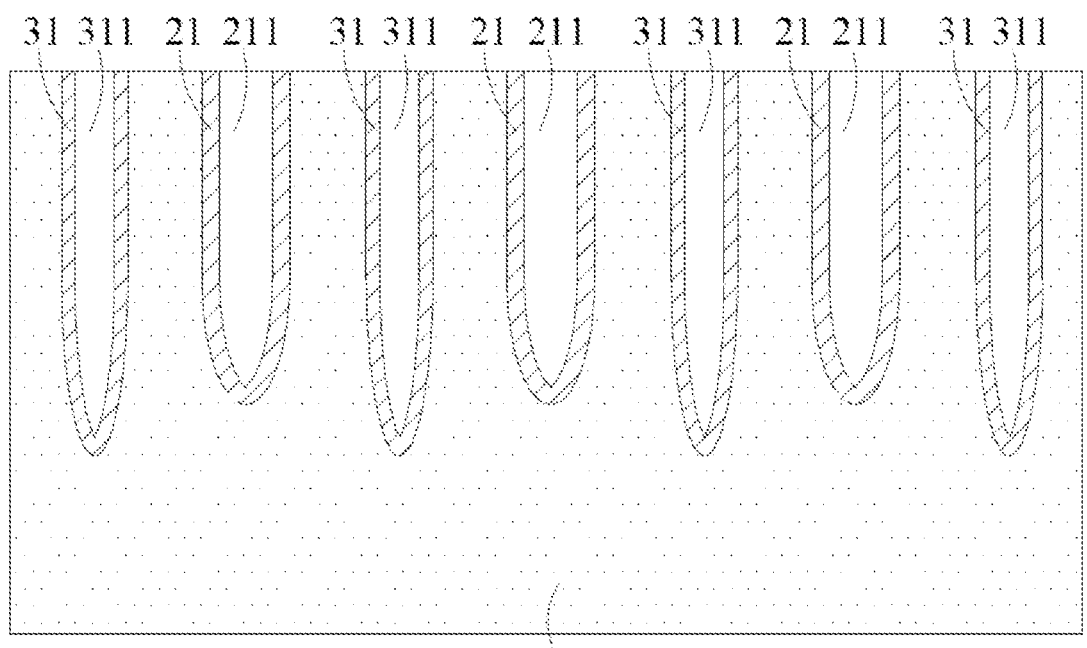
FIG. 6 is a second schematic structural diagram of various steps of manufacturing a semiconductor device in FIG. 1.

Referring to FIG. 6, the first inter-gate dielectric layer 21 is formed on a trench wall of the first word line trench 14 by deposition, sputtering or evaporation, where the first groove 211 adapted to the first word line trench 14 is formed on the first inter-gate dielectric layer 21; and meanwhile, the second inter-gate dielectric layer 31 is formed on a trench wall of the second word line trench 15 by deposition, sputtering or evaporation, where the third groove 311 adapted to the second word line trench 15 is formed on the second inter-gate dielectric layer 31.

Since the width of the second word line trench 15 is less than the width of the first word line trench 14, and the depth of the second word line trench 15 is greater than the depth of the second word line trench 15, the trench wall of the second word line trench 15 is steeper than the trench wall of the first word line trench 14. The material of the inter-gate dielectric layer is not easy to deposit on a trench wall of the second word line trench 15, but easy to deposit on a trench wall of the first word line trench 14, so that the thickness of the first inter-gate dielectric layer 21 is greater than the thickness of the second inter-gate dielectric layer 31. Since the materials of the inter-gate dielectric layer deposited in the first word line trench 14 and the second word line trench 15 are the same, the dielectric constant of the second inter-gate dielectric layer 31 is equal to the dielectric constant of the first inter-gate dielectric layer 21.

In other exemplary implementation modes of the disclosure, the material of the second inter-gate dielectric layer 31 and the material of the first inter-gate dielectric layer 21 may be different. For example, the dielectric constant of the second inter-gate dielectric layer 31 may be greater than the dielectric constant of the first inter-gate dielectric layer 21. The specific formation process of the first inter-gate dielectric layer 21 and the second inter-gate dielectric layer 31 is as follows.

Figure 7:
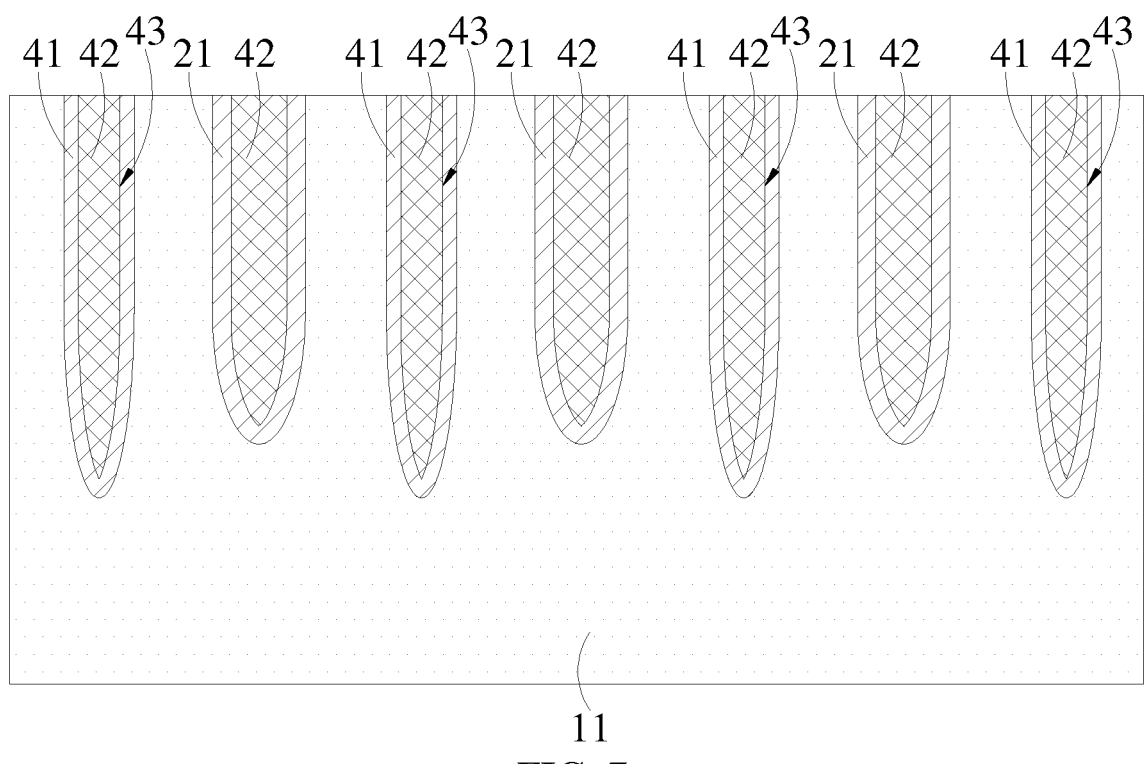
FIG. 7 is a first schematic structural diagram of various steps of manufacturing a semiconductor device in FIG. 2.

Referring to FIG. 7, the first inter-gate dielectric layer 21 is formed on a trench wall of the first word line trench 14 by deposition, sputtering or evaporation, where the first groove 211 adapted to the first word line trench 14 is formed on the first inter-gate dielectric layer 21; and meanwhile, a first sacrificial layer 41 is formed on a trench wall of the second word line trench 15 by deposition, sputtering or evaporation, where a fifth groove 43 adapted to the second word line trench 15 is formed on the second inter-gate dielectric layer 41. The first inter-gate dielectric layer 21 and the first sacrificial layer 41 are formed simultaneously, have the same material, which may be silicon oxide, and its dielectric constant is 3.9. A second sacrificial layer 42 is formed in the first groove 211 and the fifth groove 43 by deposition, sputtering or evaporation. The material of the second sacrificial layer 42 may be polysilicon or, of course, silicon germanium (SiGe).

Figure 8:
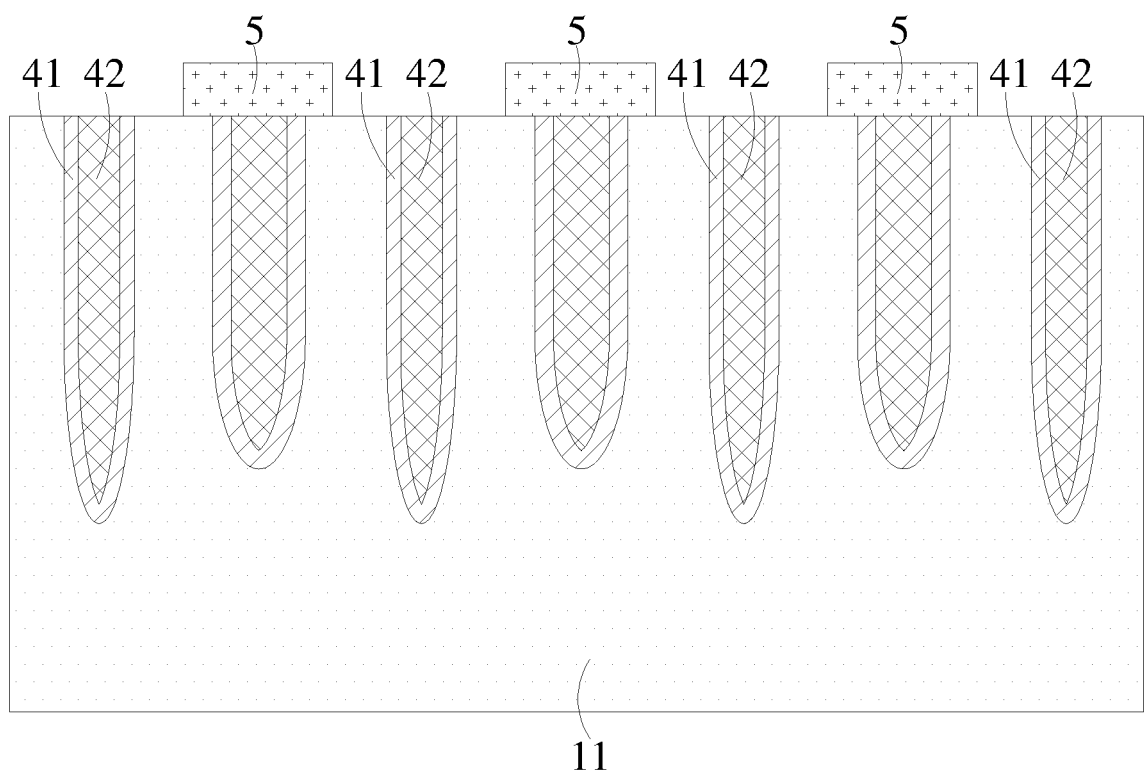
FIG. 8 is a second schematic structural diagram of various steps of manufacturing a semiconductor device in FIG. 2.

Referring to FIG. 8, a mask layer 5 is formed on the substrate 1, and the material of the mask layer 5 may be photoresist. The first word line trench 14 is located in an orthographic projection of the mask layer 5 on the substrate 1, that is, the mask layer 5 masks the first word line trenches 14 and their internal first inter-gate dielectric layers 21 and second sacrificial layers 42 to avoid damage caused by subsequent processes.

Figure 9:
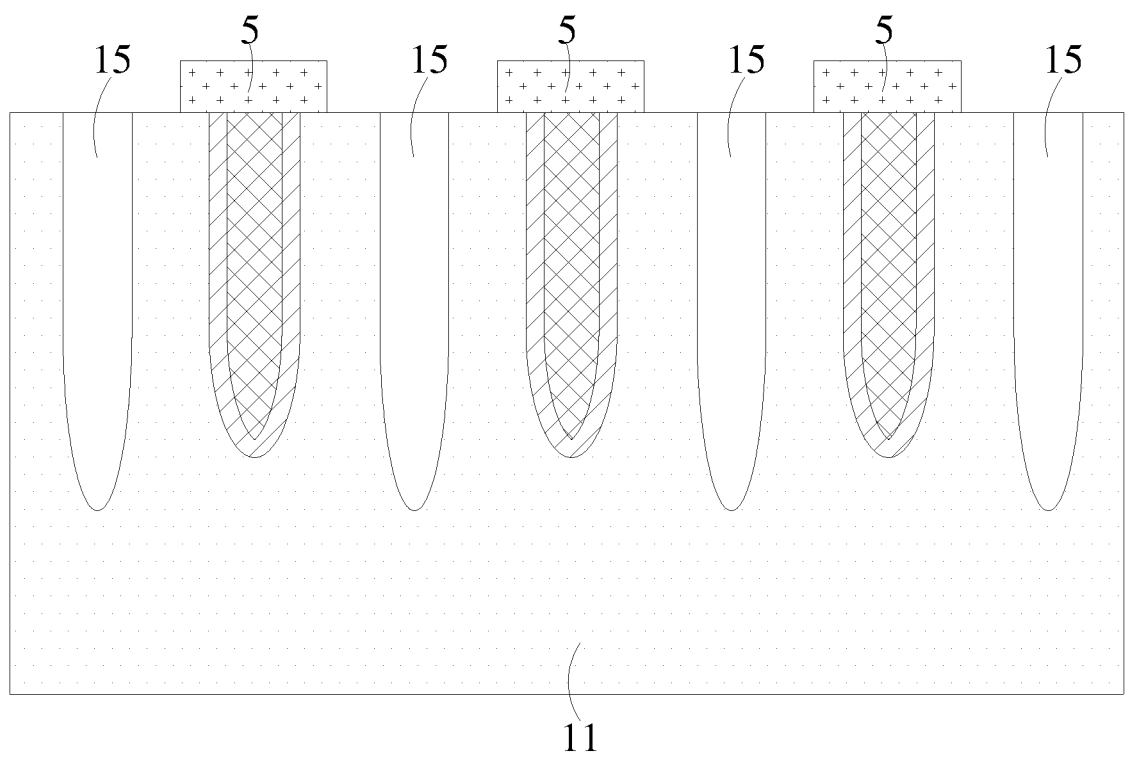
FIG. 9 is a third schematic structural diagram of various steps of manufacturing a semiconductor device in FIG. 2.

Referring to FIG. 9, the first sacrificial layer 41 and the second sacrificial layer 42 in the second word line trench 15 are removed to expose the trench wall of the second word line trench 15.

Figure 10:
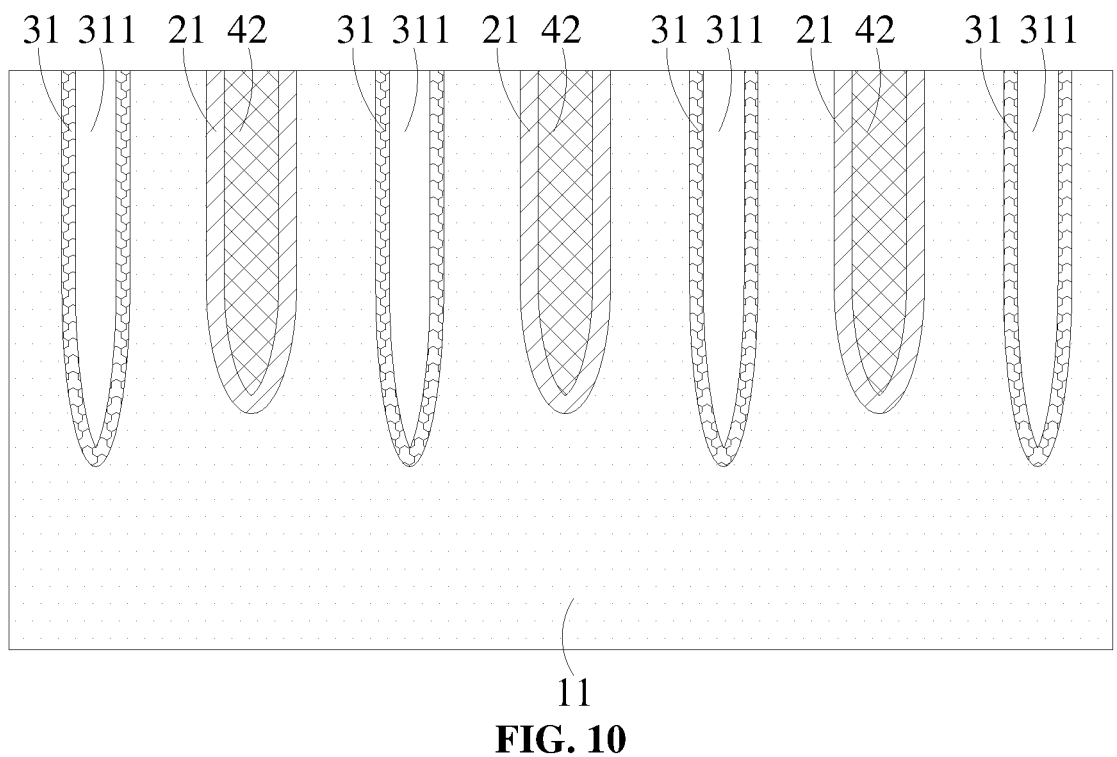
FIG. 10 is a fourth schematic structural diagram of various steps of manufacturing a semiconductor device in FIG. 2.

Referring to FIG. 10, the second inter-gate dielectric layer 31 is formed in the second word line trench 15 by deposition, sputtering or evaporation, where the third groove 311 adapted to the second word line trench 15 is formed on the second inter-gate dielectric layer 31; and the mask layer 5 is removed. The material of the second inter-gate dielectric layer 31 may be hafnium oxide (HfO), zirconia (ZrO) and hafnium oxysilicate (HfSiO), and its dielectric constant is greater than or equal to 20 and less than or equal to 30. The trench wall of the second word line trench 15 is relatively steep. The material of the second inter-gate dielectric layer 31 is not easy to deposit on a trench wall of the second word line trench 15, so that the thickness of the first inter-gate dielectric layer 21 is greater than the thickness of the second inter-gate dielectric layer 31, and the dielectric constant of the second inter-gate dielectric layer 31 is greater than the dielectric constant of the first inter-gate dielectric layer 21.

Figure 11:
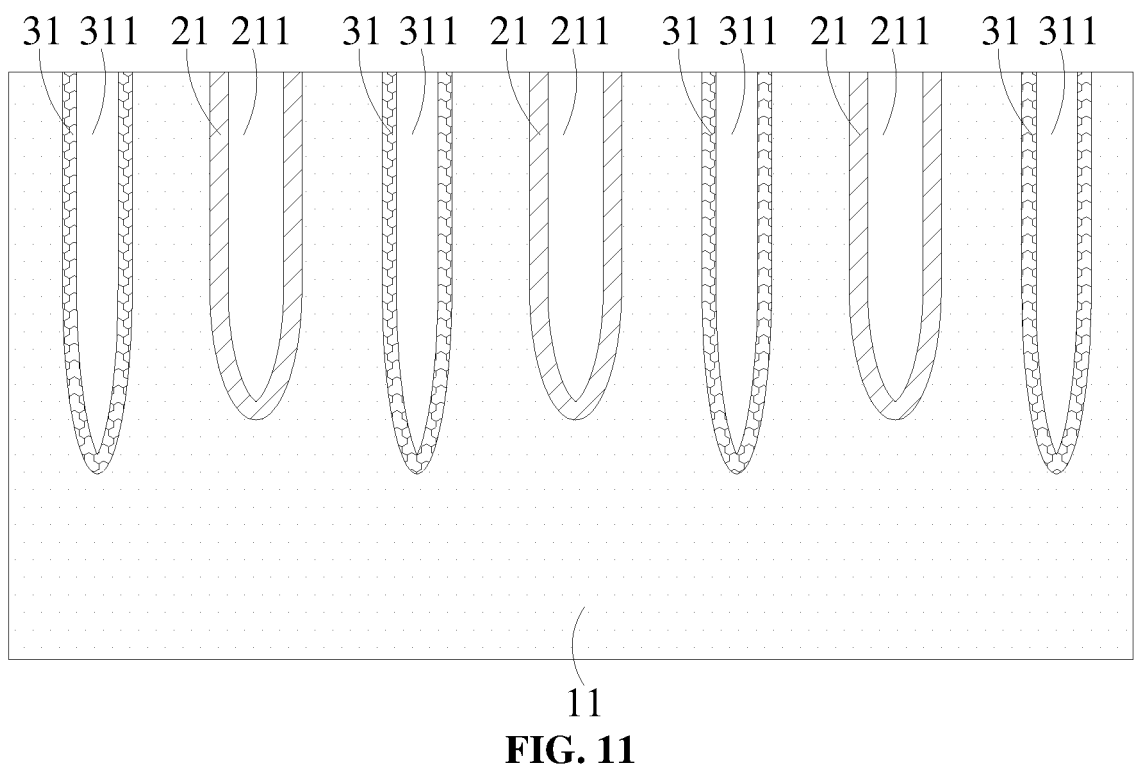
FIG. 11 is a fifth schematic structural diagram of various steps of manufacturing a semiconductor device in FIG. 2.

Referring to FIG. 11, the second sacrificial layer 42 in the first groove 211 is removed to expose the first inter-gate dielectric layer 21, and the first groove 211 is still formed.

Thus, the manufacturing of the first inter-gate dielectric layer 21 and the second inter-gate dielectric layer 31 is completed. The subsequent manufacturing methods of the first conductive layer 22, the second conductive layer 23, the third conductive layer 32, the fourth conductive layer 33, the first insulating layer 24 and the second insulating layer 34 are the same.

Figure 12:
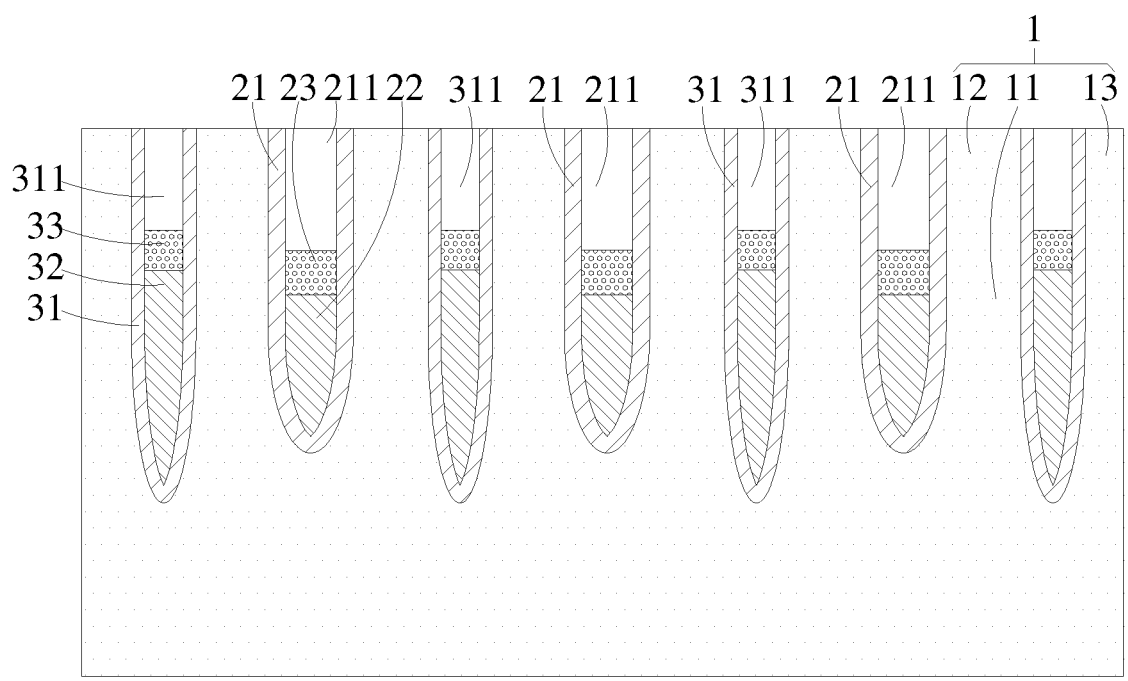
FIG. 12 is a third schematic structural diagram of various steps of manufacturing a semiconductor device in FIG. 1.

Specifically, as shown in FIG. 12, the first conductive layer 22 is formed in the first groove 211 by deposition, sputtering or evaporation, and meanwhile, the third conductive layer 32 is formed in the third groove 311 by deposition, sputtering or evaporation. The first conductive layer 22 and the third conductive layer 32 are formed simultaneously with the same material. Since the width of the first groove 211 is greater than the width of the third groove 311, the material is deposited faster in the third groove 311, so that the height of the third conductive layer 32 is higher than the height of the first conductive layer 22.

The second conductive layer 23 is formed on the first conductive layer 22 by deposition, sputtering or evaporation, and meanwhile, the fourth conductive layer 33 is formed on the third conductive layer 32 by deposition, sputtering or evaporation; the second conductive layer 23 and the fourth conductive layer 33 are formed simultaneously with the same material. Since the height of the third conductive layer 32 is higher than the height of the first conductive layer 22, the height of an upper surface of the fourth conductive layer 33 is higher than the height of the second conductive layer 23.

Referring to FIG. 1 and FIG. 2, the first insulating layer 24 is formed on the second conductive layer 23 by deposition, sputtering or evaporation, and the first insulating layer 24 fills the first groove 211. Meanwhile, the second insulating layer 34 is formed on the fourth conductive layer 33 by deposition, sputtering or evaporation, and the second insulating layer 34 fills the third groove 311. The first insulating layer 24 and the second insulating layer 34 are formed simultaneously with the same material.

The base substrate of the substrate 1 is doped to form a plurality of sources 12 and a plurality of drains 13, the plurality of sources 12 and the plurality of drains 13 are formed on respective active areas 11, part of the sources 12 and drains 13 are located on both sides of respective first word line trenches 14, and part of the sources 12 and drains 13 are located on both sides of respective second word line trenches 15 respectively. An overlapping area between an orthographic projection of the second conductive layer 23 on the reference plane and an orthographic projection of the source 12 or the drain 13 on the reference plane is smaller than the overlapping area between an orthographic projection of the fourth conductive layer 33 on the reference plane and the orthographic projection of the source 12 or the drain 13 on the reference plane. The reference plane is parallel to an extension direction of the first word line trench 14 and the second word line trench 15, and perpendicular to the substrate 1. In the exemplary implementation mode, an upper surface of the second conductive layer 23 is coplanar with a lower surface of the source 12 or the drain 13, and an upper surface of the fourth conductive layer 33 is higher than the lower surface of the source 12 or the drain 13.

The features, structures or features described above may be combined in one or more implementation modes in any proper manner, and the features discussed in the various embodiments are interchangeable if possible. In the descriptions above, many specific details are provided to give a full understanding of the implementation modes of the disclosure. However, those skilled in the art will realize that: the technical solutions of the disclosure may be practiced and one or more of the specific details are omitted, or other methods, parts, materials and the like may be adopted. In other cases, known structures, materials or operation will not be shown or described in detail to avoid each aspect of the disclosure from being obscured.

The terms "about" and "approximately" used in this specification usually mean within 20%, preferably within 10%, and more preferably within 5%, of a given value or range. The quantity given here is approximately quantity, which means that the meaning of "about", "approximately", "roughly" and "probably" may still be implied without specific description.

Although this specification uses relative terms such as "upper" and "lower" to describe the relative relationship of one assembly of the icon to another, these terms are used in this specification only for convenience, for example, the example direction described in the drawings. It is understood that, if the device of the icon is turned upside down, the assembly described as "upper" will become the assembly described as "lower". Other relative terms, such as "high", "low", "top", "bottom", etc., also have similar meanings. When a structure is "upper" of other structures, it may mean that this structure is integrally formed on other structures, or that this structure is "directly" on other structures or this structure is "indirectly" on other structures through another structure.

In the specification, terms "one", "a/an", "the", "described" are used to indicate one or more elements/ constituent parts/etc. Terms "include", "comprise" and "have" are used to express an open sense of including and to indicate that additional elements/constituent parts/and the like may exist in addition to the listed elements/constituent parts/and the like; and the terms "first", "second" and "third" are used only as marks, not as quantitative restrictions on their objects.

It can be understood that, application of the disclosure does not be limited to detailed structures and arrangement modes of parts disclosed by the specification. The disclosure may have other implementation modes, and may realize and execute the implementation modes in many forms. The foregoing modifications and improvements shall fall within the scope of the disclosure. It can be understood that, the disclosure disclosed and limited in the specification extends to all replaceable combinations of the above in the test and/or the drawings or obvious two or more independent features. All these different combinations form multiple replaceable aspects of the disclosure. All the implementation modes of the specification illustrate the known best mode for realizing the disclosure, and furthermore, those skilled in the art can utilize the disclosure.

What is claimed is:

1. A semiconductor device, comprising:
    a substrate, one or more first word line trenches and one or more second word line trenches being alternately arranged on the substrate in parallel;
    first word lines, each of which is arranged in a respective first word line trench; and
    second word lines, each of which is arranged in a respective second word line trench,
    wherein a width of the first word line trench is greater than a width of the second word line trench, and a depth of the first word line trench is less than a depth of the second word line trench, so that a width of the first word line is greater than a width of the second word line, a height of the first word line is less than a height of the second word line, and a threshold voltage of the first word line is greater than a threshold voltage of the second word line.

2. The semiconductor device according to claim 1, wherein the substrate comprises:
    a plurality of active areas, arranged in an array; and
    a plurality of sources and a plurality of drains, arranged on respective active areas, wherein part of the sources and drains are located on both sides of respective first word line trenches, and part of the sources and drains are located on both sides of respective second word line trenches.

3. The semiconductor device according to claim 2, wherein the first word line comprises:
    a first inter-gate dielectric layer, arranged on a trench wall of the first word line trench, wherein a first groove adapted to the first word line trench is arranged on the first inter-gate dielectric layer;
    a first conductive layer, arranged in the first groove;
    a second conductive layer, arranged on the first conductive layer; and
    a first insulating layer, arranged on the second conductive layer.

4. The semiconductor device according to claim 3, wherein the second word line comprises:
    a second inter-gate dielectric layer, arranged on a trench wall of the second word line trench, wherein a third groove adapted to the second word line trench is arranged on the second inter-gate dielectric layer;
    a third conductive layer, arranged in the third groove;
    a fourth conductive layer, arranged on the third conductive layer; and a second insulating layer, arranged on the fourth conductive layer.

5. The semiconductor device according to claim 4, wherein an overlapping area between an orthographic projection of the second conductive layer on a reference plane and an orthographic projection of the source or the drain on the reference plane is smaller than an overlapping area between an orthographic projection of the fourth conductive layer on the reference plane and the orthographic projection of the source or the drain on the reference plane, wherein the reference plane is parallel to an extension direction of the first word line trench and the second word line trench, and perpendicular to the substrate.

6. The semiconductor device according to claim 5, wherein an upper surface of the second conductive layer is coplanar with a lower surface of the source or the drain, and an upper surface of the fourth conductive layer is higher than the lower surface of the source or the drain.

7. The semiconductor device according to claim 4, wherein a thickness of the first inter-gate dielectric layer is greater than a thickness of the second inter-gate dielectric layer.

8. The semiconductor device according to claim 7, wherein a dielectric constant of the second inter-gate dielectric layer is equal to or greater than a dielectric constant of the first inter-gate dielectric layer.

9. A manufacturing method of a semiconductor device, comprising:
   forming a substrate, and forming one or more first word line trenches and one or more second word line trenches which are alternately arranged in parallel on the substrate;
   forming a first word line in each first word line trench, and forming a second word line in each second word line trench;
   wherein a width of the first word line trench is greater than a width of the second word line trench, and a depth of the first word line trench is less than a depth of the second word line trench, so that a width of the first word line is greater than a width of the second word line, a height of the first word line is less than a height of the second word line, and a threshold voltage of the first word line is greater than a threshold voltage of the second word line.

10. The manufacturing method of a semiconductor device according to claim 9, wherein forming the substrate comprises:
    providing a base substrate of the substrate, and forming a plurality of active areas on the base substrate of the substrate.

11. The manufacturing method of a semiconductor device according to claim 10, wherein forming the one or more first word line trenches and the one or more second word line trenches which are alternately arranged in parallel on the substrate comprises:
    etching a first surface of the substrate to form first word line trenches arranged in parallel;
    masking the first word line trenches, applying voltage to a second surface of the substrate opposing the first surface, and etching a part between two adjacent first word lines on the first surface of the substrate to form the second word line trenches arranged in parallel, so that a width of the first word line trench is greater than a width of the second word line trench, and a depth of the first word line trench is less than a depth of the second word line trench.

12. The manufacturing method of a semiconductor device according to claim 11, wherein forming the first word line in each first word line trench and forming the second word line in each second word line trench comprises:
    forming a first inter-gate dielectric layer on a trench wall of the first word line trench, a first groove adapted to the first word line trench being formed on the first inter-gate dielectric layer, and meanwhile forming a first sacrificial layer on a trench wall of the second word line trench, a fifth groove adapted to the second word line trench being formed on the first sacrificial layer;
    forming a second sacrificial layer in the first groove and the fifth groove;
    forming a mask layer on the substrate, the first word line trench being located in an orthographic projection of the mask layer on the substrate;
    removing the first sacrificial layer and the second sacrificial layer in the second word line trench;
    forming a second inter-gate dielectric layer in the second word line trench, a third groove adapted to the second word line trench being formed on the second inter-gate dielectric layer;
    removing the mask layer; and
    removing the second sacrificial layer in the first groove,
    wherein a thickness of the first inter-gate dielectric layer is greater than a thickness of the second inter-gate dielectric layer, and a dielectric constant of the second inter-gate dielectric layer is greater than a dielectric constant of the first inter-gate dielectric layer.

13. The manufacturing method of a semiconductor device according to claim 12, wherein forming the first word line in each first word line trench and forming the second word line in each second word line trench further comprises:
    forming a first conductive layer in the first groove, and meanwhile forming a third conductive layer in the third groove, wherein a height of an upper surface of the third conductive layer is higher than a height of an upper surface of the first conductive layer;
    forming a second conductive layer on the first conductive layer, and meanwhile forming a fourth conductive layer on the third conductive layer, wherein a height of an upper surface of the fourth conductive layer is higher than a height of an upper surface of the second conductive layer; and
    forming a first insulating layer on the second conductive layer, and meanwhile forming a second insulating layer on the fourth conductive layer.

14. The manufacturing method of a semiconductor device according to claim 13, wherein forming the substrate further comprises:
    doping a base substrate of the substrate to form a plurality of sources and a plurality of drains, wherein the plurality of sources and the plurality of drains are formed on respective active areas, part of the sources and drains are located on both sides of respective first word line trenches, part of the sources and drains are located on both sides of respective second word line trenches, an overlapping area between an orthographic projection of the second conductive layer on a reference plane and an orthographic projection of the source or the drain on the reference plane is smaller than an overlapping area between an orthographic projection of the fourth conductive layer on the reference plane and the orthographic projection of the source or the drain on the reference plane, wherein the reference plane is parallel to an extension direction of the first word line trench and the second word line trench, and perpendicular to the substrate.

15. The manufacturing method of a semiconductor device according to claim 14, wherein an upper surface of the second conductive layer is coplanar with a lower surface of the source or the drain, and an upper surface of the fourth conductive layer is higher than the lower surface of the source or the drain.

16. The manufacturing method of a semiconductor device according to claim 11, wherein forming the first word line in each first word line trench and forming the second word line in each second word line trench comprises:

forming a first inter-gate dielectric layer on a trench wall of the first word line trench, a first groove adapted to the first word line trench being formed on the first inter-gate dielectric layer, and meanwhile forming a second inter-gate dielectric layer on a trench wall of the second word line trench, a third groove adapted to the second word line trench being formed on the second inter-gate dielectric layer, wherein a thickness of the first inter-gate dielectric layer is greater than a thickness of the second inter-gate dielectric layer, and a dielectric constant of the second inter-gate dielectric layer is equal to a dielectric constant of the first inter-gate dielectric layer.

\* \* \* \* \*